(12) United States Patent
Sonnenberg et al.

(10) Patent No.: US 8,904,881 B2
(45) Date of Patent: Dec. 9, 2014

(54) ULTRASOUND TRANSDUCER ASSEMBLY AND ULTRASOUND FLOWMETER

(75) Inventors: Hans-Michael Sonnenberg, Ansbach (DE); Gerhard Dietz, Lichtenau (DE); Harald Kroemer, Ansbach (DE); Wilhelm Oefelein, Ansbach (DE); Tino Hofmann, Neustadt/Aisch (DE); Axel Schmidt-Schoenian, Merkendorf (DE); Roland Horn, Weihenzell (DE)

(73) Assignee: Hydrometer GmbH, Ansbach (DE)

(*) Notice: Subject to any disclaimer, the term of this patent is extended or adjusted under 35 U.S.C. 154(b) by 208 days.

(21) Appl. No.: 13/697,077

(22) PCT Filed: May 11, 2011

(86) PCT No.: PCT/EP2011/002333
§ 371 (c)(1),
(2), (4) Date: Nov. 9, 2012

(87) PCT Pub. No.: WO2011/141167
PCT Pub. Date: Nov. 17, 2011

(65) Prior Publication Data
US 2013/0047743 A1    Feb. 28, 2013

(30) Foreign Application Priority Data

May 12, 2010  (DE) .......................... 10 2010 020 338
Jul. 21, 2010  (DE) .......................... 10 2010 031 753
Aug. 10, 2010  (DE) .......................... 10 2010 033 858

(51) Int. Cl.
*H01L 41/047* (2006.01)
*G01F 1/66* (2006.01)

(52) U.S. Cl.
CPC .............. *H01L 41/047* (2013.01); *G01F 1/662* (2013.01)
USPC ....................................... 73/861.27

(58) Field of Classification Search
USPC ................................. 73/861.27–29
See application file for complete search history.

(56) References Cited

U.S. PATENT DOCUMENTS 4,505,160 A * 3/1985 Zacharias, Jr. ............. 73/861.18
5,179,862 A * 1/1993 Lynnworth ................ 73/861.28
5,515,733 A * 5/1996 Lynnworth ................ 73/861.27

FOREIGN PATENT DOCUMENTS

DE        296 11 678 U1   9/1997
DE   10 2005 001 895 A1   7/2006

(Continued)

OTHER PUBLICATIONS

International Search Report dated Jan. 27, 2012 issued in PCT/EP2011/002333.

*Primary Examiner* — Jewel V Thompson
(74) *Attorney, Agent, or Firm* — Scully, Scott, Murphy & Presser, P.C.

(57) ABSTRACT

The present invention relates to an ultrasound transducer assembly for an ultrasound flowmeter, comprising a one-part or multi-part housing (2), which is provided to be connected to a line carrying the medium to be measured, wherein the ultrasound transducer transmits ultrasound through the housing (2) and the ultrasound transducer assembly has the following features:
- an ultrasound transducer body (4, 7) with a first main surface on the side facing the medium and a second main surface on the side facing away from the medium,
- first, preferably planar, contact means for electrically contacting the first main surface of the ultrasound transducer body (4, 7),
- second, preferably planar, contact means for electrically contacting the second main surface of the ultrasound transducer body (4, 7), wherein the first contact means are located between the ultrasound transducer body (4, 7) and the housing (2), through which ultrasound is to be transmitted, of the ultrasound flowmeter. To simplify the construction it is proposed to place the first contact means of the ultrasound transducer body (4, 7) loosely in the housing (2) or to fix them on the housing side.

20 Claims, 15 Drawing Sheets

(56) References Cited

FOREIGN PATENT DOCUMENTS

| | | |
|---|---|---|
| EP | 0 260 335 A1 | 3/1988 |
| EP | 0 532 971 A1 | 3/1993 |
| EP | 0 708 313 A2 | 4/1996 |
| EP | 0 890 826 A1 | 1/1999 |
| EP | 2 037 231 A1 | 3/2009 |
| EP | 2 236 993 A1 | 10/2010 |
| EP | 2 236 995 A1 | 10/2010 |
| JP | 2005-189090 A | 7/2005 |

* cited by examiner

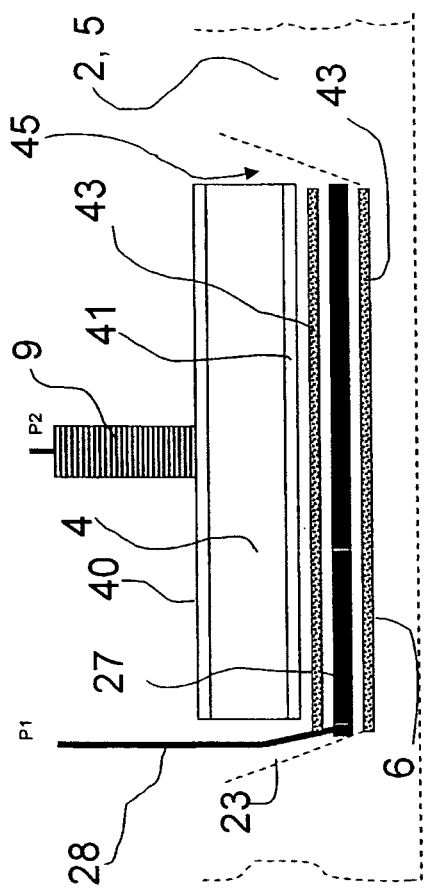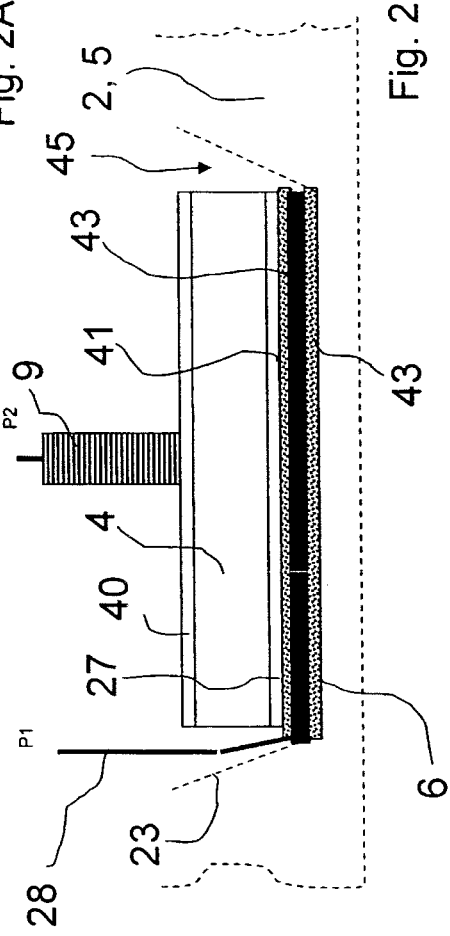

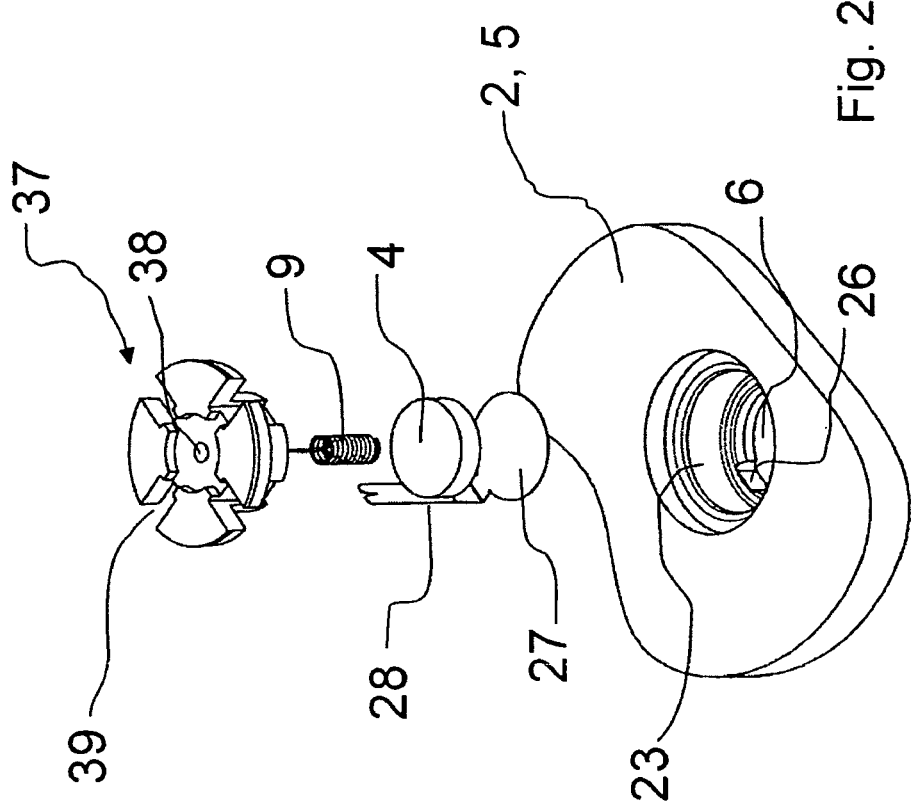

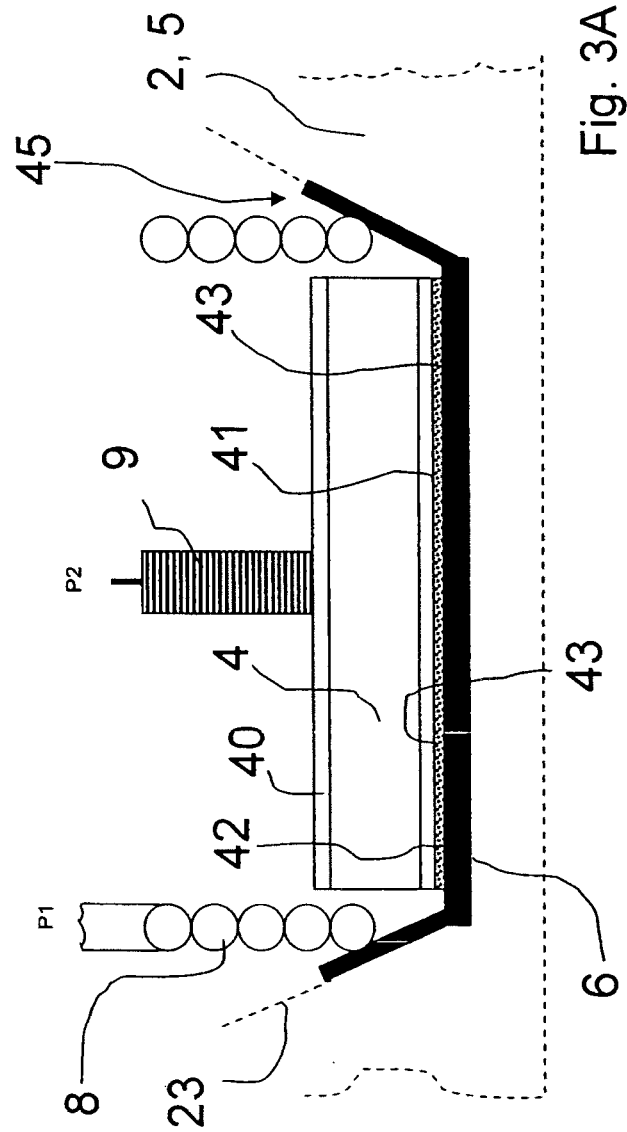

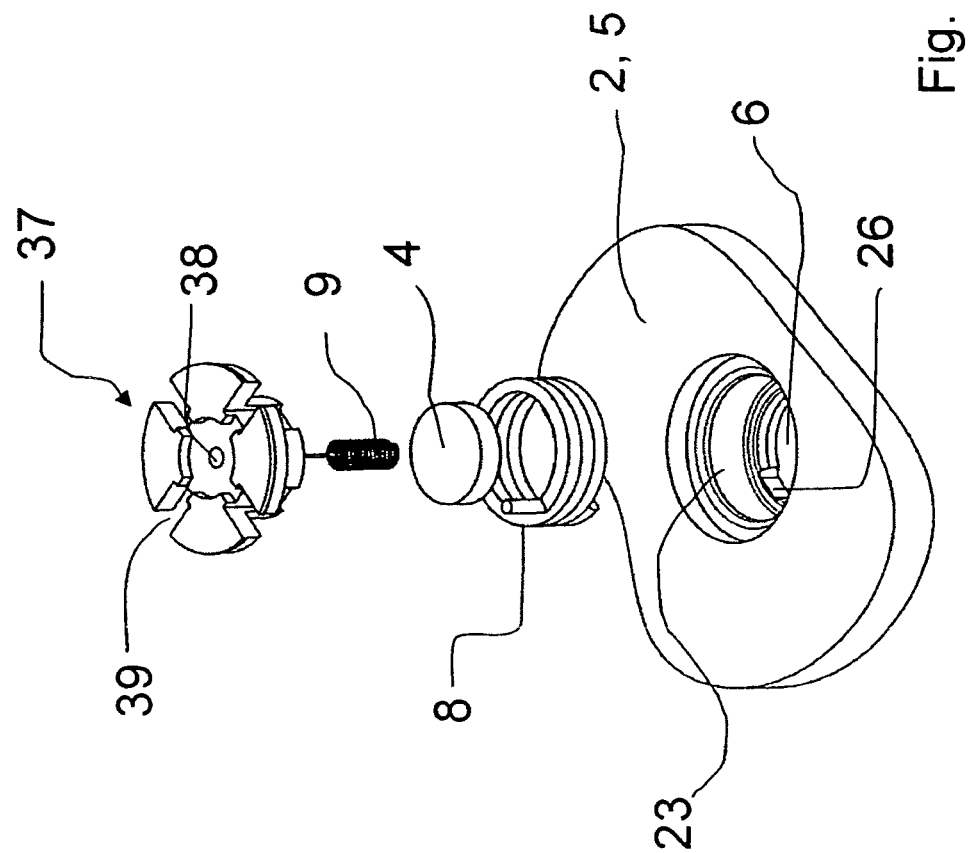

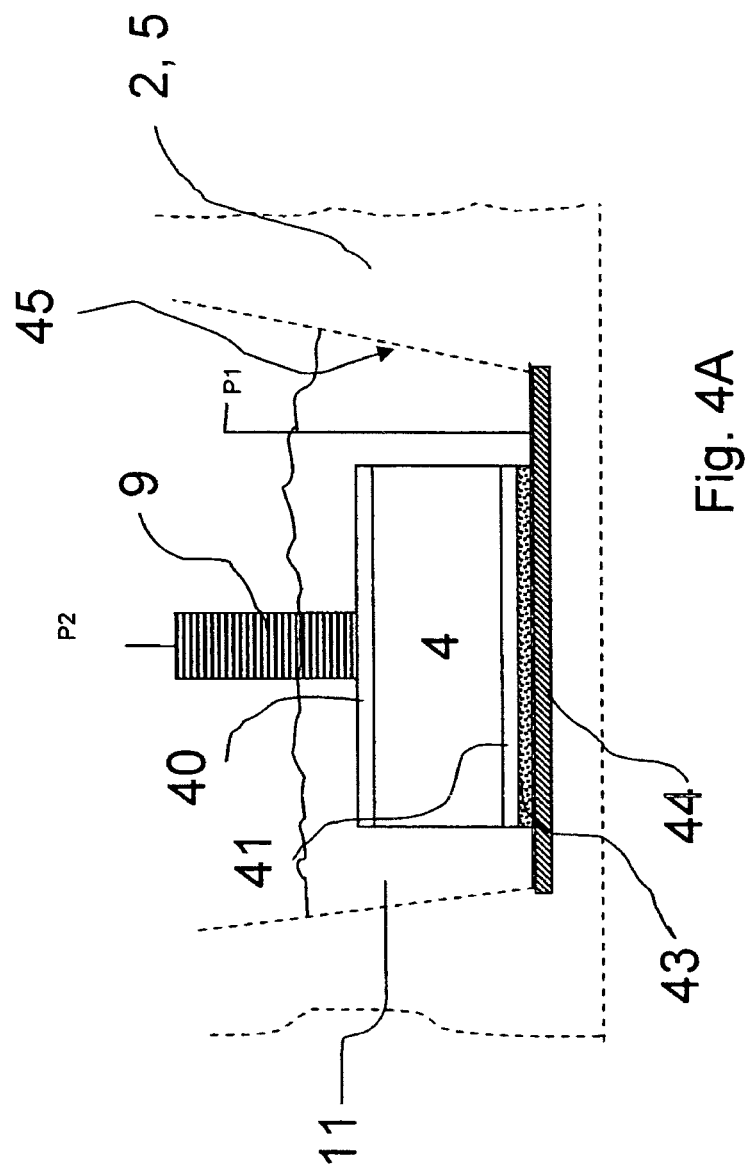

ULTRASOUND TRANSDUCER ASSEMBLY AND ULTRASOUND FLOWMETER

The present invention relates to an ultrasound transducer assembly for ultrasound flowmeters according to the preamble of claim 1. The present invention further relates to an ultrasound flowmeter comprising a corresponding ultrasound transducer assembly.

TECHNICAL BACKGROUND

The sealing and contacting of ultrasound flowmeters is a technically demanding and complex process. Housing openings have to be sealed using filigree seal elements made of the best sealing material. Due to the increased use of plastics materials, with which manufacturing tolerances cannot normally be ruled out, leaks may easily occur under specific operating conditions due to the small dimensions of the seal elements. Even if high-quality sealing material and time-consuming manual processing are selected, leaks still cannot be ruled out.

In recent years, the tendency has been to position ultrasound transducers in a housing so that the ultrasound burst produced by the ultrasound transducer enters the medium through a thin housing wall, generally consisting of plastic.

PRIOR ART

An ultrasound meter which contains a one-piece housing and a separate assembly unit comprising the two ultrasound transducer bodies and the printed circuit board is known from each of EP 2 236 993 A1 and EP 2 236 995 A1. The two ultrasound transducer bodies are located in corresponding cutouts in the printed circuit board and are fixed by retaining clips on the upper and lower sides. The assembly unit comprising the ultrasound transducer bodies and the printed circuit board is fitted on a flat housing region in such a way that the ultrasound transducers transmit ultrasound through the housing in the region of the flat housing region.

A corresponding ultrasound flowmeter is known from EP 0 708 313, in which, in the housing thereof, which normally consists of a cast part, ultrasound transducers are introduced into openings assigned to each individual ultrasound transducer with the aid of a respective sleeve nut and an O-ring. A temperature sensor is likewise housed in a respective housing opening. This construction is based on a large number of individual parts. In addition, it requires complex processing of the housing.

A housing for an ultrasound flowmeter is known from EP 2 037 231 A1, in which a one-piece, monolithic housing with planar contact points arranged on the outer face for the positioning of ultrasound transducers is used. The ultrasound transducers are fastened with a specific spacing along the housing on the outer face thereof and transmit ultrasound through the wall of the housing during operation.

A device for measuring flow is known from DE 10 2005 001 895 B4, in which the fluid flow is guided around a flow partitioning wall positioned perpendicular to the direction of flow. An ultrasound transducer assembly is located at the end face of the flow-partitioning wall in a recess in the housing. The ultrasound transducer assembly comprises merely one piezo oscillator with a single earth electrode and two planar signal electrodes arranged side by side and separately from one another, wherein a radiating surface and a receiving surface for ultrasound signals are assigned to each signal electrode.

An ultrasound flowmeter having a metering insert made of plastic is known from EP 0 890 826 B1. The metering insert is located in a recess in the housing of the flowmeter and is sealed with respect to the housing on an inlet side via a single seal. In addition, the metering insert has a cover, which is sealed with respect to the metering insert via a peripheral seal. Two passages, into each of which an ultrasonic transducer comprising an ultrasound transducer body and a respective housing is introduced, likewise with insertion of a seal, are located in the cover.

Problem

The problem addressed by the present invention is that of providing a new ultrasound transducer assembly of the generic type that enables a reduction of the production costs.

DISCLOSURE OF THE INVENTION

The above problem is solved by the features of the characterizing part of claim 1. Expedient embodiments of the present invention are disclosed in the dependent claims and in the description.

Since the first contact means of the ultrasound transducer body are placed or fixed in the housing, in a housing part or in a housing insert, it is possible to use ultrasound transducer bodies of simple design; in particular the ultrasound transducer bodies no longer have to be contacted peripherally. It is also no longer necessary to produce separate ultrasound transducers as ready-to-use components. Due to the transmission of ultrasound through the wall, there is no need for complex sealing measures. The number of parts and the number of manufacturing steps are reduced to a minimum. Risks of failure as a result of damage caused by an adhesive or soldered joint between the electrode and the body of the ultrasound transducer becoming defective over time are reduced. Operational reliability increases.

If a loose electrode is provided as the first contact means of the ultrasound transducer body, it can easily be placed in an indentation provided therefor in the housing or in part thereof or in the housing insert, where it can then be fixed in position between the ultrasound transducer body and the housing wall through which ultrasound is to be transmitted.

Alternatively, the first contact means may be provided as a contact layer already applied previously to the housing or to the housing part or to the housing insert. In this case, the first contact means may expediently be a conductive layer, precipitated for example from a gas phase, such as a contact layer applied by metal deposition and (previously) connected fixedly to the housing or housing part or housing insert. Alternatively, a conductive layer can be produced by plating, by thermal metal spraying or by hot-dipped coating. A powder coating made of conductive material can also be used. The ultrasound transducer body can thus easily be applied to or placed in the housing carrying the contact means.

As a further alternative embodiment, the first contact means may also be provided as a conductor layer or conductor structure integrated into the housing or into the housing part or into the housing insert. Two-component injection molding, that is to say what is known as the MID method, the hot embossing method, the mask exposure method, laser structuring or foil back injection molding can also be used for this purpose. The ultrasound transducer body can also be easily applied to or placed in the housing or housing part carrying the contact means.

The ultrasound transducer body can be fixed under a bias acting in the axial direction on the inserted electrode or on the housing wall carrying the contact means. The fixing process is expediently carried out via a spring, which simultaneously ensures electrical contact of one side of the ultrasound transducer body.

The first contact means is connected via a connecting lug, for example via a connecting lug molded integrally on the electrode and protruding upwardly or via a self-centering connection means, such as a spring, in particular in the form of what is known as a spiral spring. The latter extends along the outer periphery of the ultrasound transducer body.

In accordance with a further aspect of the present invention, which has also been claimed in a further independent claim, the ultrasound transducer body is housed in a housing insert which is pot-shaped in particular, through which ultrasound can be transmitted and which preferably consists of plastic. This housing insert is inserted into a corresponding housing opening, whereby a multi-part housing with a blind-bore-like indentation in the region of the respective transducer body can be produced. The housing insert through which ultrasound can be transmitted and which preferably consists of plastic also offers advantages in terms of production, irrespective of the design of the electrode. For example, this is true even if the electrode is fastened fixedly to the ultrasound transducer or if contact is achieved via metallization (peripheral contacting) guided upwardly from the lower face.

A closure part or a cover may be provided to close the housing insert on the upper face. In this case, the connections can be guided outward via the upper face of the closure part. The transducer assembly according to the invention can thus be produced easily as a component that can be handled independently (separate assembly unit) and is merely still to be contacted at the printed circuit board. The remaining housing may thus have a simpler form, whereby the production costs of the housing can in turn be reduced considerably.

In addition, the space surrounding the ultrasound transducer body may be filled, at least in part, with casting compound. Oxidation can thus be avoided.

The housing insert may either have just one ultrasound transducer body or a plurality (in particular a pair) of ultrasound transducer bodies, as required.

In accordance with a further aspect of the present invention, with an assembly that comprises a first and a second ultrasound transducer body, an electrical contacting (for example earth potential) fixed on the housing side and common to the first and second ultrasound transducer bodies is provided for the first main surface of each of the ultrasound transducer bodies in question. The construction can thus be simplified considerably.

The present invention further relates to an ultrasound flowmeter comprising an ultrasound transducer assembly according to at least one of claims 1 to 15.

EXEMPLARY EMBODIMENTS OF THE INVENTION

Expedient embodiments of the present invention will be explained in greater detail hereinafter on the basis of the figures in the drawing. For the sake of clarity, recurrent features are merely provided once with a reference sign. Combinations of individual or partial features in the embodiments described below are also considered expressly to be essential to the invention.

In the figures:

FIG. 2 shows an ultrasound transducer assembly in accordance with a first embodiment of the invention during assembly (FIG. 2A) and after assembly (FIG. 2B), in each case without a closure part, and also in a perspective exploded view (FIG. 2C);

FIG. 3 shows an ultrasound transducer assembly in accordance with a second embodiment of the invention in a sectional illustration (FIG. 3A) without a closure part and also in a perspective exploded view (FIG. 3B);

Figure 13A:
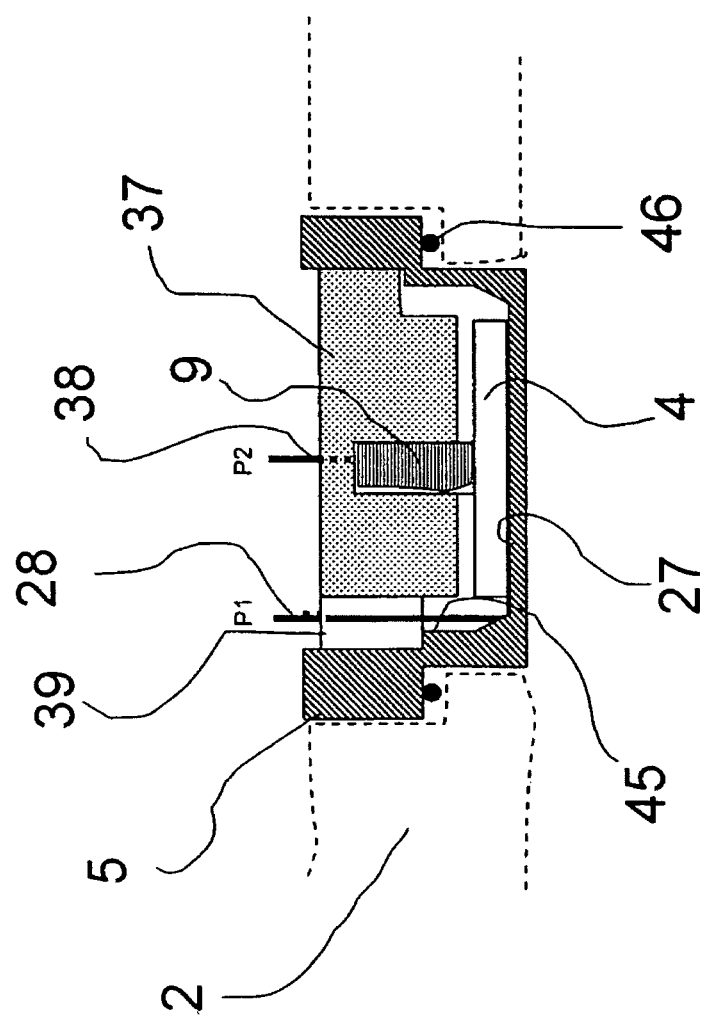
Figure 13B:
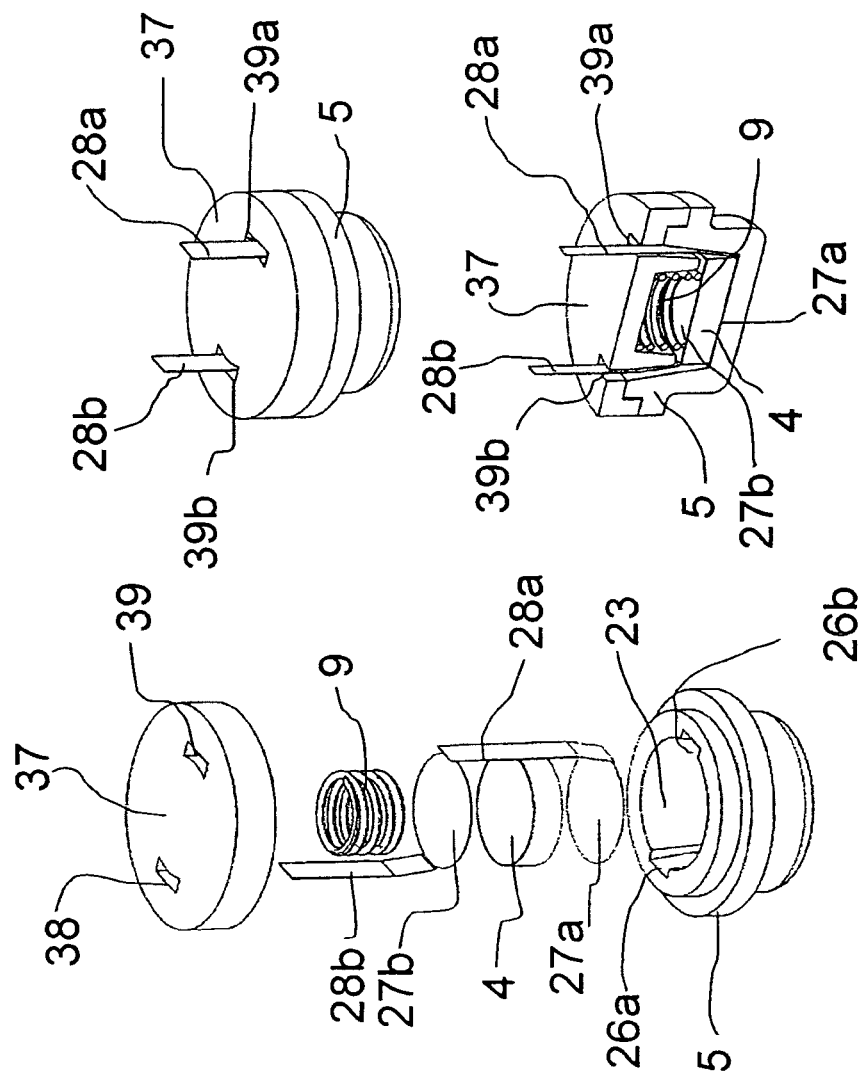
Figure 14A:
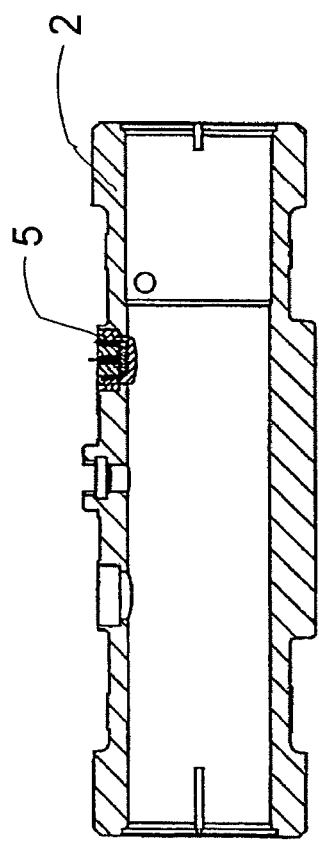
Figure 14B:
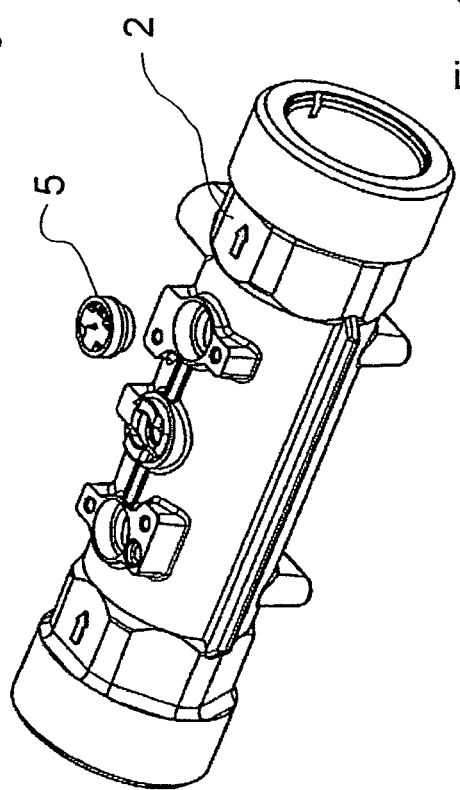

FIG. 13 shows further embodiments of the ultrasound transducer assembly according to the invention in the form of a cup-shaped housing insert, for example with upper-face contacting of the ultrasound transducer body by a spring (FIG. 13A) or by an electrode, inserted via the upper face, with connecting lugs (FIG. 13B), and FIG. 14 shows a sectional illustration (FIG. 14A) and a perspective illustration (FIG. 14B) of an illustration of a housing of an ultrasound flowmeter.

Figure 1:
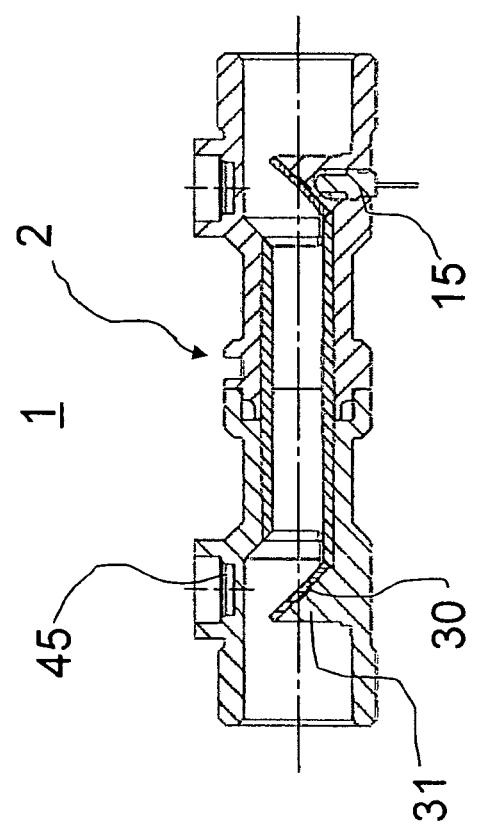
FIG. 1 shows a sectional illustration through the housing of an ultrasound meter with transmission of ultrasound through the wall.

FIG. 1 shows the housing 2 of an ultrasound flowmeter 1, said housing consisting of two parts joined together in the middle for example. A pocket-shaped recess 45, in each case for the insertion of an ultrasound transducer (not illustrated), is located in the upper face of the respective housing part. The base of the pocket-shaped recess 45 in the housing 2 is thin-walled so that ultrasound can be transmitted into the medium flowing through the ultrasound flowmeter. Two deflecting mirrors 30, which are carried by deflecting mirror holders 31 and deflect the ultrasound signal (ultrasound burst) to form a U-shaped measuring path, are located in the housing 2. A temperature sensor 15 may also be housed in a housing recess. The two parts of the housing 2 expediently consist of a plastic, in particular a thermoplastic, which can be processed by means of what is known as injection molding.

FIG. 2 shows a first embodiment of the ultrasound transducer assembly according to the invention, which is located in a housing 2, or housing part or insert part 5 in the housing, said housing or housing part or insert part being indicated by a dashed line. According to FIG. 2A, the ultrasound transducer body 4, that is to say the disc made of piezoceramic, is provided with a fixedly attached metallization 40, 41 (for example Ag), both on the upper face and on the lower face. In this embodiment the housing 2 or housing part or the insert part 5 has a pocket-shaped recess 45 with a bearing surface 6 as well as surfaces 23 extending outwardly at an incline. For electrical contacting of the ultrasound transducer body 4, a loose electrode 27 is provided, which is placed in the recess 45 tapering inwardly at an incline and is fitted on the bearing surface 6. For contacting (electrical potential P1), the electrode 27 has a laterally arranged connecting lug 28. The latter is formed in one piece with the electrode 27. Counter-contacting (electrical potential P2) of the opposite face of the ultrasound transducer body 4 is implemented by means of a spring 9 in the form of a spiral spring. As illustrated in FIG. 2, a sound-coupling compound 43, for example in the form of a sound-coupling gel or the like, can additionally be provided on both sides of the electrode 27 as required. The inward tapering of the recess 45 contributes to the fact that the electrode 27 is centered as it is inserted.

The spring 9 is not only used to electrically contact the upper face of the ultrasound transducer body 4, but also to fix said ultrasound transducer body in position within the pocket-shaped recess 45.

As can be seen from FIG. 2C, a cover or closure part 37 can be provided to close the housing 2 or housing part or the insert part 5 at the upper face of the assembly. Said cover or closure part comprises an inner recess (not illustrated; see also FIG. 13) for centering the spring 9 at the inner face of the cover. The straight connection piece of the spring 9 can be guided outwardly via a central bore 38 and contacted preferably directly with the printed circuit board (not illustrated). A total of four radial cutouts 39 for example are further provided over the periphery and make it possible for the connecting lug 28 of the electrode 27 to be guided outwardly through the closure part 37 and toward the printed circuit board.

An indentation 26 is located inside the housing 2 or housing part or insert part 5 and makes it possible to guide the connecting lug 28 upwardly with a specific lateral offset from the region of the bearing surface 6.

FIG. 3A shows a further embodiment of the ultrasound transducer assembly according to the invention in a highly simplified manner. Instead of a loosely introduced printed circuit board, a contact layer 42 applied to the housing 2 or housing part or insert part 5, for example by metal deposition of the base of the pocket-shaped indentation 45, is provided in this embodiment. This contact layer 42 may extend upwardly along the inclined surface 23, additionally over part thereof. Electrical contacting (electrical potential P1) of the contact layer 42 is implemented for example by means of an outer spring 8, for example a spiral spring, which surrounds the outer face of the ultrasound transducer body 34. Contacting (electrical potential P2) by means of the spring 9 corresponds to the embodiment already described at the outset. A sound-coupling compound 43 may expediently be located on the upper face of the contact layer 42.

As can be seen in FIG. 3B, the spring 8 is applied in the region of the surface 23 and provides a sufficiently large interior that makes it possible for the ultrasound transducer body 4 to lie against the bearing surface 6 of the housing 2. The cover 37 corresponds to the embodiment of the cover 37 according to FIG. 2C.

Figure 4B:
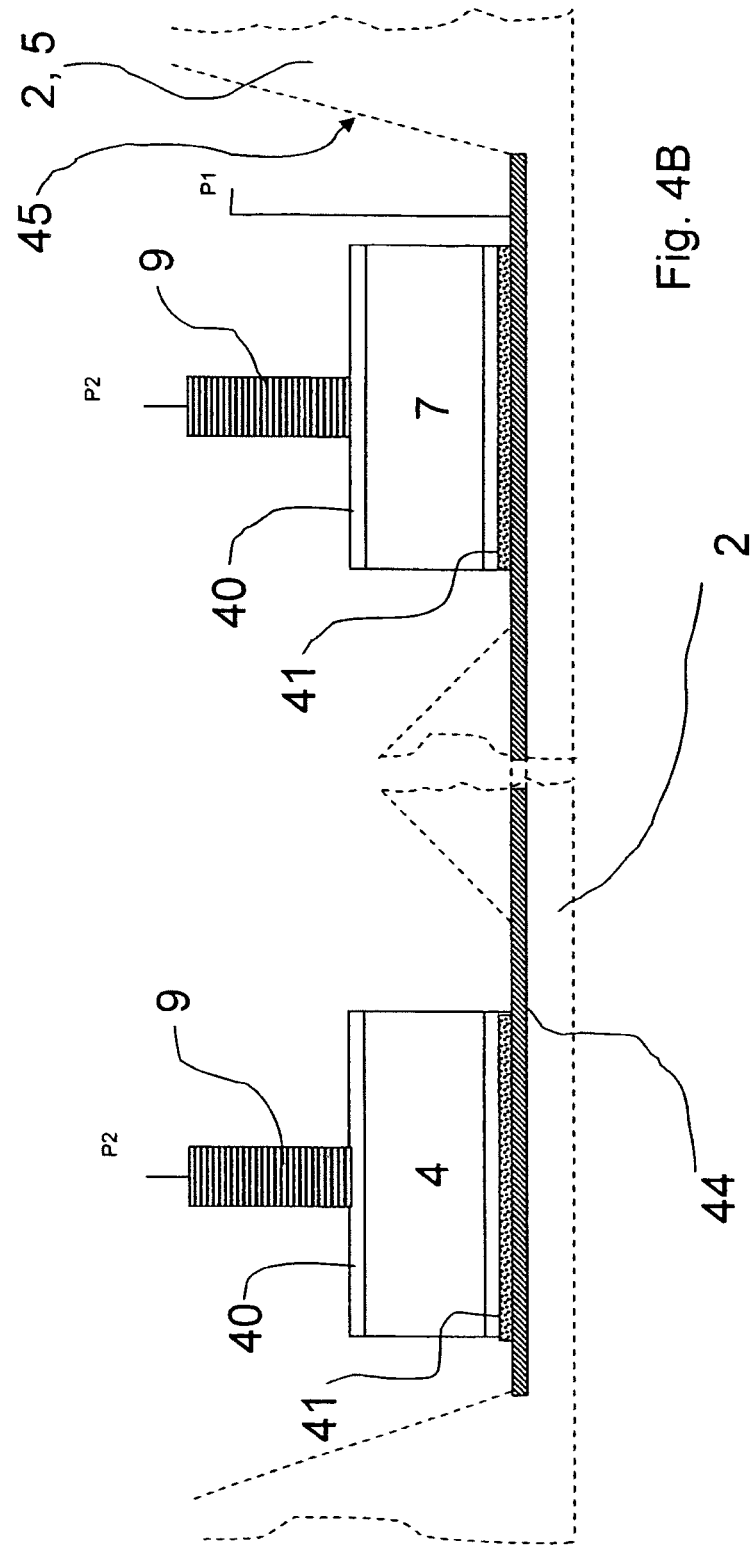
FIG. 4 shows an ultrasound transducer assembly in accordance with a third embodiment of the invention in a sectional illustration of a region of an ultrasound transducer body (FIG. 4A) and also with common contacting between two ultrasound transducer bodies (FIG. 4B)
Figure 5:
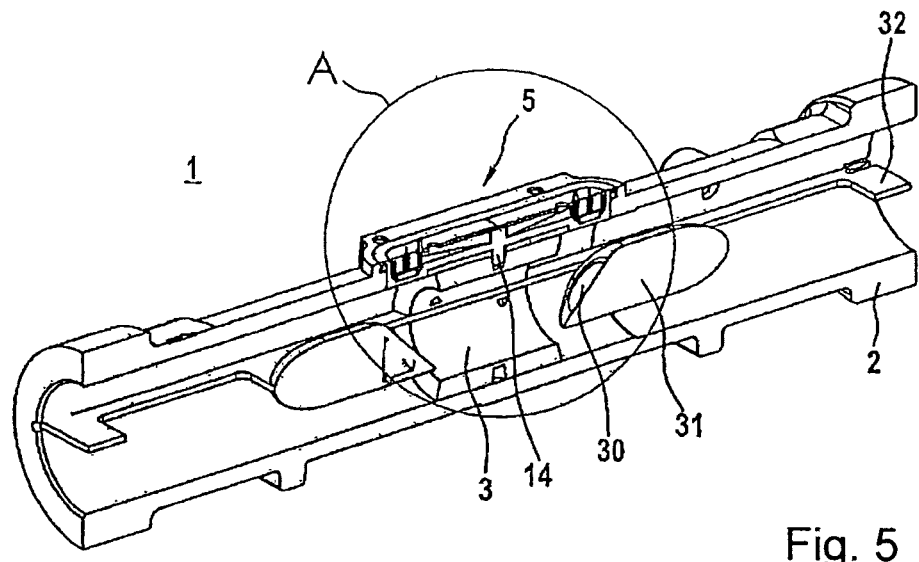
FIG. 5 shows a perspective sectional illustration of an ultrasound transducer assembly according to the present invention of an ultrasound flowmeter housed in a particular embodiment of a housing assembly.

In the embodiment according to FIG. 4A the side of the ultrasound transducer body 4 facing the medium is contacted by a conductor path structure 44 integrated into the housing 2 or housing part or insert part 5. This conductor path structure 44 is already anchored in the plastic of the housing during production thereof. In this case, the housing is consequently a component in which metal conductor paths have been applied to an injection molded plastic substrate. This is achieved for example by what is known as two-component injection molding, hot embossing, mask exposure, laser structuring or foil back injection molding. The conductor path structure 44 can be contacted (electrical potential P1) in various ways, for example via a spring, as is illustrated in FIGS. 3A and 3B. In this case too, a sound-coupling compound 43 may be provided between the ultrasound transducer body 4 and the conductor path structure 44.

This embodiment also allows the provision of a conductor path structure 44 along the entire housing 2 or housing part or insert part 5. In this case, both ultrasound transducer bodies 4, 7 can be connected to just one common connecting electrode, merely by means of single contacting (electrical potential P1). For example, the electrical contacting P1 may be a common earth connection.

FIGS. 1 to 7 described above are longitudinal sections of various embodiments of the ultrasound transducer assemblies according to the invention, in which insert parts 5 are provided that house two ultrasound transducer bodies 4, 7. FIG. 8 is a partial longitudinal section.

Reference sign 5 in FIG. 1 denotes an ultrasound flowmeter, which is installed in a stationary manner in a fluid line (not illustrated), for example a hot water line and/or a cold water line, to detect the flow rate of fluid. The ultrasound flowmeter 1 has an elongate tubular housing 2 for this purpose, which normally consists of cast metal. The housing is connected to the fluid line network via suitable connection means (not illustrated) on the end faces of the housing.

The ultrasound flowmeter 1 has a measuring insert 3 located in the interior of the housing 2, said measuring insert having an annular measuring portion reducing the cross section in the embodiment illustrated specifically in FIG. 1, said measuring portion extending along the space located between the two deflecting mirrors 30. The deflecting mirrors 30 are carried by deflecting mirror holders 31 formed in a streamlined manner, which are in turn carried by a frame 32, which simultaneously acts as a flow divider.

The measuring insert 3 is slid into the housing 2 of the ultrasound flowmeter 1 at one end, together with the previously described components.

Figure 7:
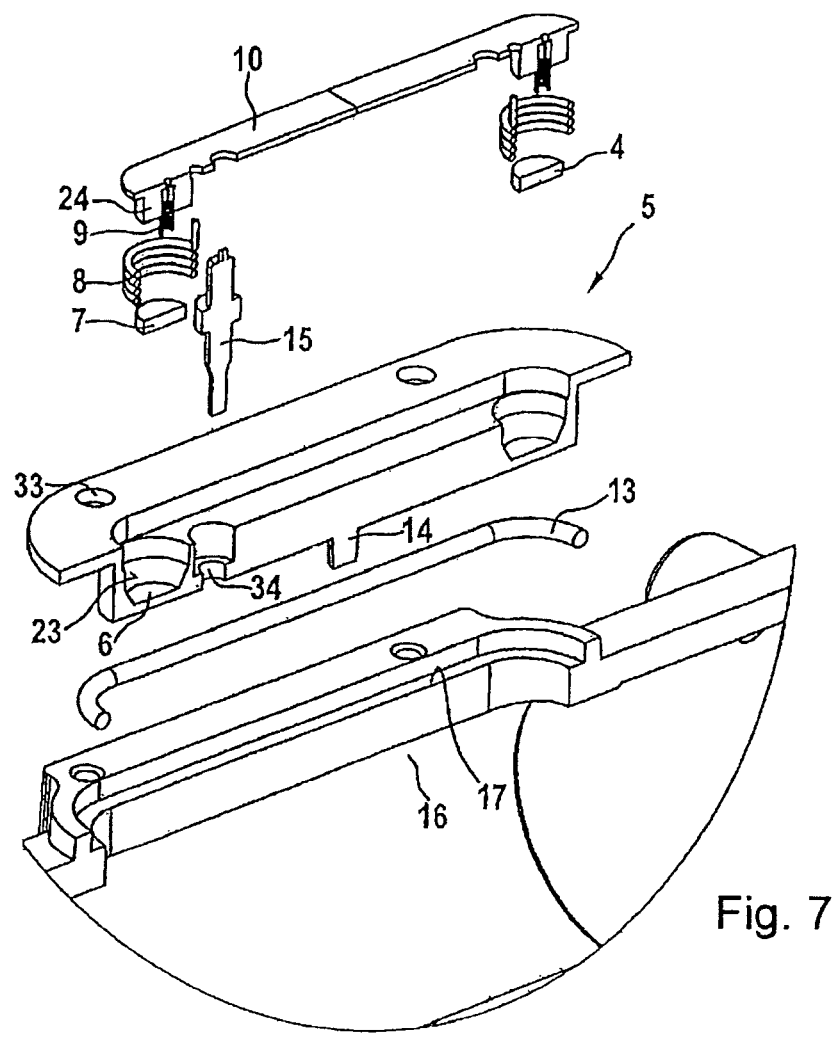
FIG. 7 shows a perspective, exploded sectional illustration of the individual parts of the housing insert in accordance with the embodiment according to FIGS. 5 and 6.
Figure 8:
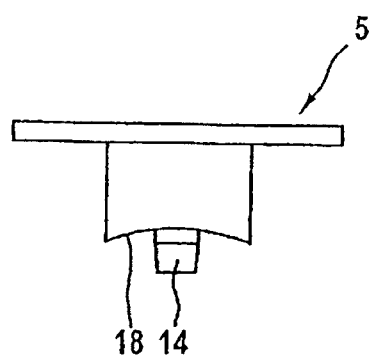
FIG. 8 shows a view from an end face of the housing insert in accordance with the embodiment according to FIGS. 5 to 7.

An elongate housing opening 16, which is provided to receive a housing insert 5, is located in the upper face of the housing 2 (see also FIG. 7). The housing insert 5 is used to position the ultrasound transducer body 4, 7 on the ultrasound flowmeter 1. The ultrasound transducer bodies 4, 7 are normally piezoceramic discs, which convert electrical energy into acoustic energy and vice versa.

The housing insert further comprises a temperature sensor 15, which extends through a bore 34 in the base region of the housing insert 5 and into the interior of the housing 2 of the ultrasound flowmeter 1 and is sealed with respect to the housing insert 5 by means of a seal element 35.

A single seal element 13 in the form of an O-ring, which is arranged peripherally in a step 17 and is of comparatively large dimension, is provided to seal the housing insert 5 with respect to the housing 2 (see FIG. 3).

The respective ultrasound transducer body 4, 7, that is to say the respective piezoceramic plate, is located on the upper face of a bearing surface 6 against the inner wall of the pot-shaped housing insert 5. This is preferably adapted to the diameter of the ultrasound transducer body 4, 7. The contact electrode on the cover side (not illustrated in the figures) is contacted via a first, centrally arranged spring 9 guided in a retaining part 24, said spring being used expediently to tap the electrical signal or for electrical actuation. The second contact electrode (also not illustrated in the figures) is contacted via a second spiral-like spring 8, which produces the earth connection. A metal coating of the inner wall of the housing insert may also be provided instead of the second contact electrode. For simplified assembly, a slanted surface 23 is provided above the bearing surface 6 and facilitates the insertion and positioning of the respective ultrasound transducer body 4, 7 over the bearing surface 6 by centering.

A cover in the form of a printed circuit board 10 with contact paths (not illustrated) is located on the upper face of the housing insert 5 and allows direct contacting of the spring 8 and spring 9.

Figure 6:
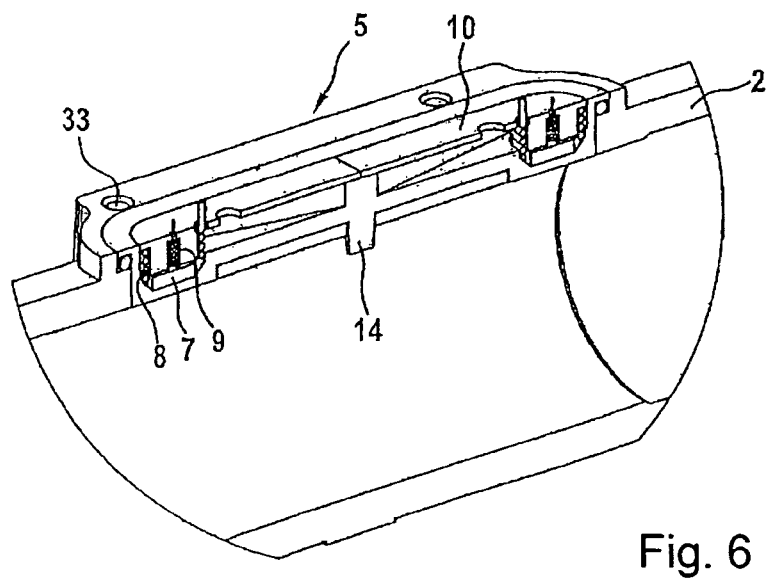
FIG. 6 shows an enlarged sectional illustration of region A in FIG. 5.

As can be seen in FIG. 6, the remaining interior of the housing insert 5 is filled with casting compound 11 so that the ultrasound transducer bodies 4, 7 and the springs 8, 9 are in contact with the casting compound 11 and the formation of condensation water is avoided.

A cover in the form of a plastic injection molded part may also be provided instead of the printed circuit board 10 for an upper closure of the housing insert 5.

The housing insert 5 is screwed to the housing in a pressure-proof and watertight manner by means of screws (not illustrated) and possibly retaining parts (also not illustrated).

A peg 14 protruding at the base region is used to fix in position the measuring insert 3 in the assembled state via a corresponding recess (not illustrated in the figures) in said measuring insert.

As can be seen in FIG. 8, the lower face of the housing insert 5 is provided with an inwardly curved surface 18, which contacts the outer surface of the measuring insert 3 when the housing insert 5 is assembled.

In the variant illustrated in FIGS. 1 to 11 the lower face of the housing insert 5 is not adapted to the contour of the measuring insert 3. The housing 2 has a housing inner wall 19, which has an inner contour adapted to the outer contour of the measuring insert 3. The lower face of the housing insert 5 may be planar in this instance. The housing inner wall 19 is left when the housing opening is milled out, more specifically so that a minimal wall thickness, for example approximately 0.8 mm to 1.2 mm, remains over the center line.

The measuring insert 3 is in contact with the interior of the ultrasound flowmeter 1 via corresponding domes 21, which engage in through-openings 20 in the housing inner wall 19. The domes 21 are preferably formed such that they fill the openings 20 to the greatest possible extent so as to prevent the accumulation of air bubbles. In this embodiment the housing insert 5 can be introduced in the manner of a module for a wide range of nominal diameters.

The contacting of the ultrasound transducer bodies corresponds to that according to FIGS. 5 to 8.

To ensure sufficient stability of the housing insert under pressure, it is expedient to produce said housing insert from a high-strength material (for example plastic), preferably reinforced with an additional material (for example glass fibers).

Figure 9:
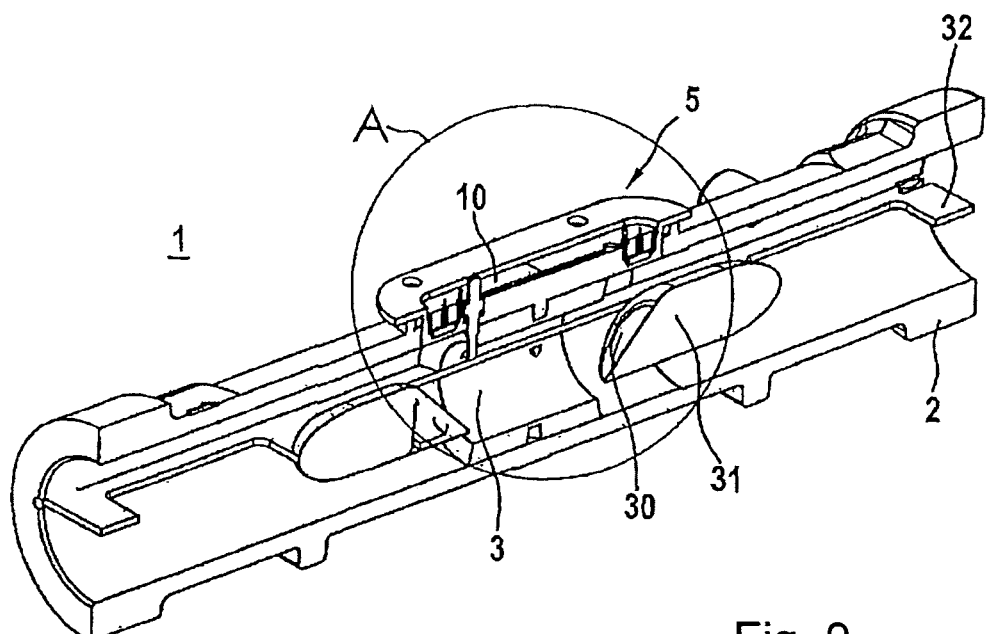
FIG. 9 shows a perspective sectional illustration of a second embodiment of a housing assembly according to the present invention with an ultrasound transducer assembly according to the present invention.
Figure 10:
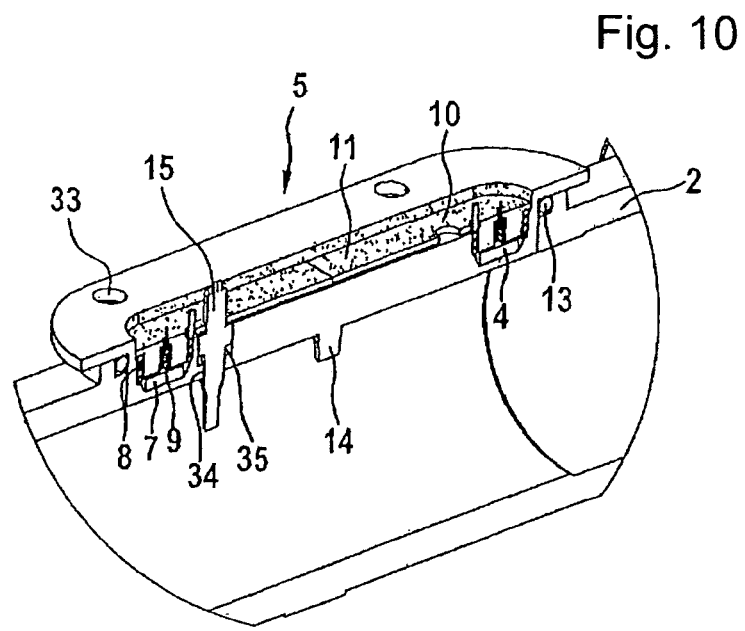
FIG. 10 shows an enlarged sectional illustration of region A in FIG. 9.
Figure 11:
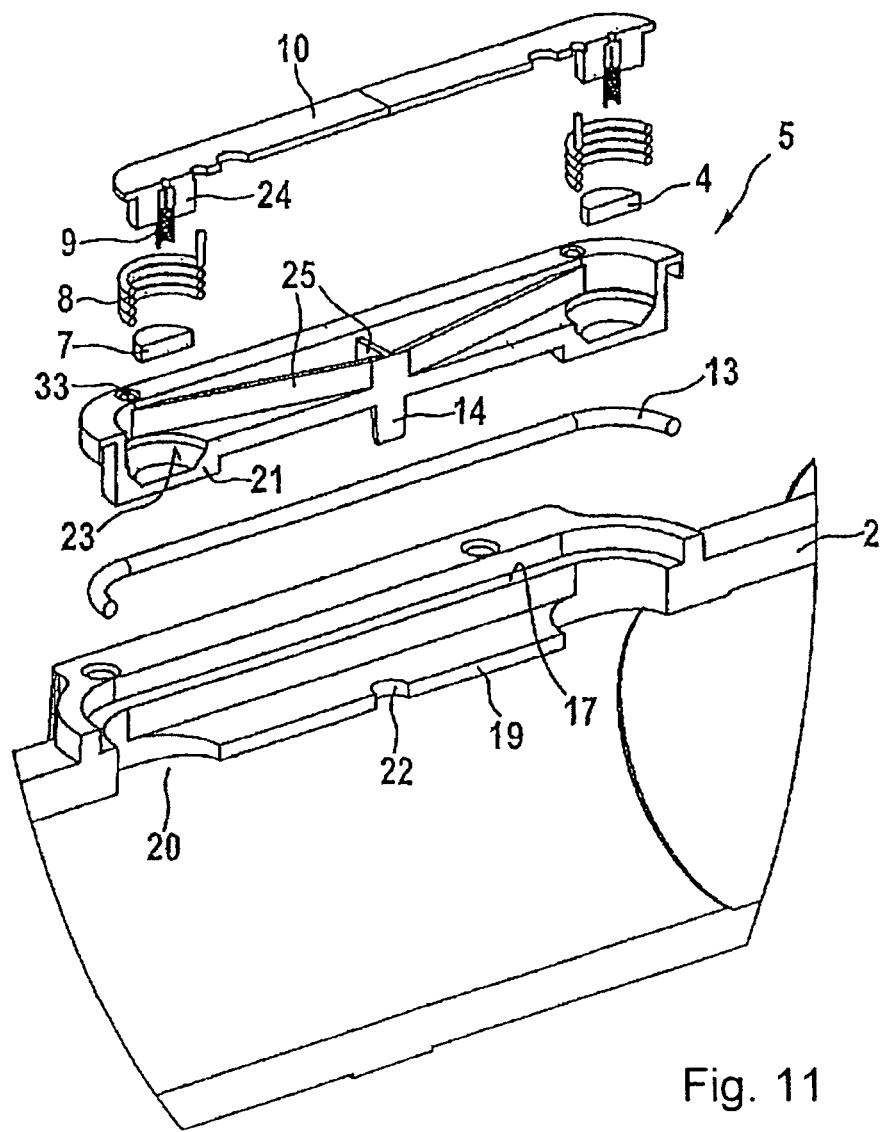
FIG. 11 shows a perspective, exploded sectional view of the individual parts of the housing insert in accordance with the embodiment according to FIGS. 9 and 10.

In addition, it is expedient to take constructive measures to increase the level of rigidity, for example bracing ribs 25 in the exemplary embodiment according to FIGS. 9 to 11. Such reinforcement measures are important, since the entire pressure of the fluid loads the wall of the housing insert 5.

Alternatively or in addition, the housing insert 5 may be provided with a necessary material strength.

In the region of the ultrasound transducer bodies 4 and 7 and of the bearing surfaces 6, the housing insert 5 should have only a small wall thickness that enables sufficient transmission of ultrasound.

The respective housing insert 5 may also be provided with a metal coating in the region of the bearing surface 6 for electrical contacting of the ultrasound transducer body 4, 7.

The respective piezoceramic discs are expediently acoustically coupled at the wall of the housing insert 5 by means of a suitable sound-conducting paste, for example made of silicone or PFPE. Alternatively, the ultrasound transducer body 4, 7 may also be glued in place, or contacting may be implemented by soldering to a contact layer of the housing insert 5. A rigid, effectively electrically conductive connection is thus formed in particular. The further electrical contacting at the upper face of the piezoceramic disc can be implemented by the spring 9, which is preferably connected fixedly to the printed circuit board 10 or soldered thereto and presses the piezoceramic disc against the membrane-like wall of the housing insert 5 with a defined force.

Figure 12:
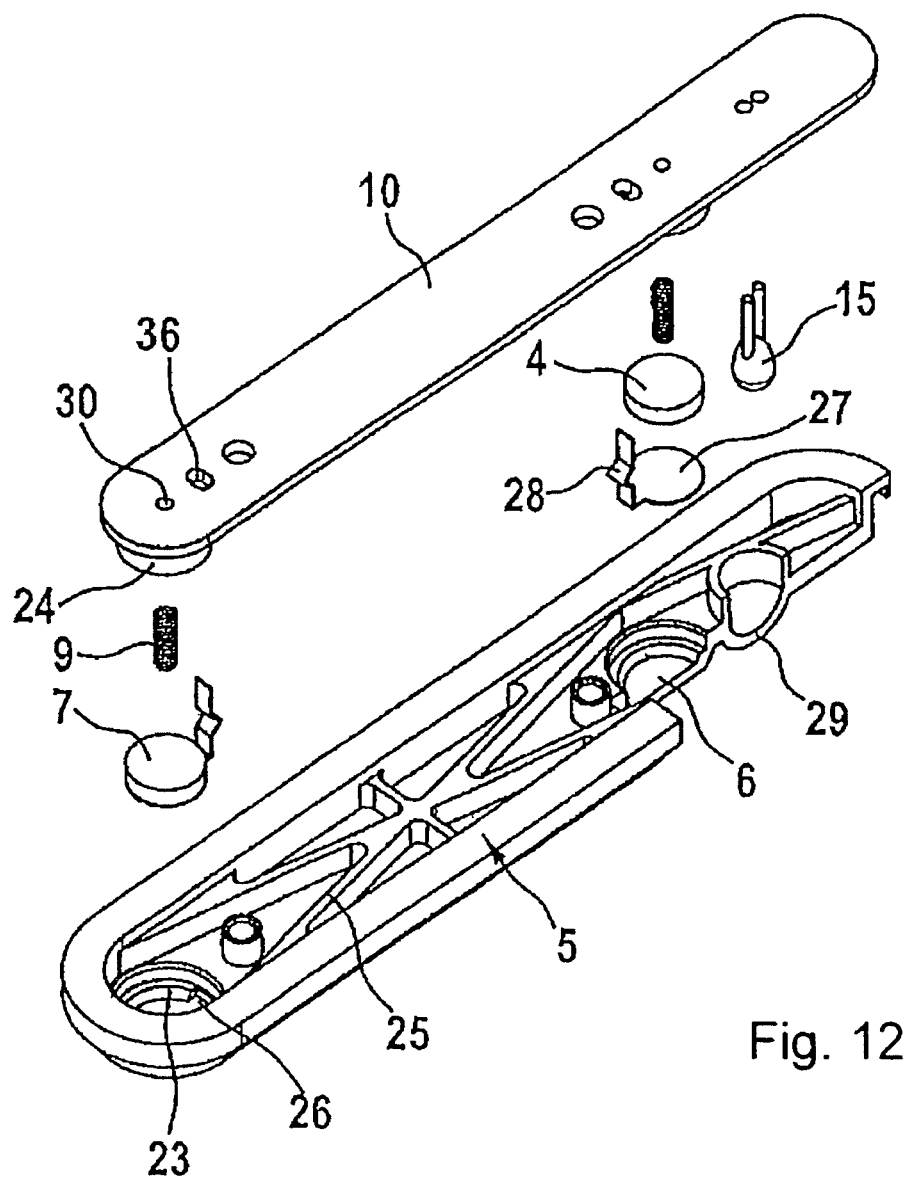
FIG. 12 shows an exploded illustration of the individual parts of the housing insert in accordance with a further embodiment of the present invention.

FIG. 12 shows a further variant, in which the temperature sensor 15, for example an "NTC element", detects the temperature of the fluid located in the ultrasound flowmeter 1 through the wall of the housing insert 5. To this end, a shaping 29 for example is provided in the base of the housing insert 5 and the temperature sensor 15 is located in said shaping. The temperature sensor may be coupled thermally to the wall of the housing insert 5 via a heat conducting paste (not illustrated). A bore in the housing insert 5 and the seal with respect to the inner face are thus omitted. Furthermore, an unencapsulated NTC element may be used, which is a considerably more cost effective option compared to the aforementioned bore and seal.

In this embodiment the ultrasound transducer bodies 4 and 7 are not contacted via a metal coating of the surface of the housing insert 5, but by means of an electrode 27, which consists of a thin metal foil. The electrode 27 is connected fixedly to the lower face of the ultrasound transducer body 4 or 7, for example glued or soldered. The electrode is illustrated in an uncoupled manner on the right-hand side in FIG. 8 to improve comprehension of the overall form thereof. For example, stainless steel (VA) or copper (Cu) may be provided as a material for the electrode 27 and can be coated with a thin layer of noble metal (for example gold or silver) depending on subsequent processing. The connecting lug 28 molded integrally on the electrode 27 is preferably soldered directly to the printed circuit board 10. The connecting lug 28 contains kinks, which are intended to prevent a disadvantageous transfer of force onto the electrode 27 as a result of thermal expansion.

Alternatively to a fixed connection of the electrode to the respective ultrasound transducer body 4, 7, a loose arrangement with interpositioning of an acoustic coupling layer, for example of a coupling gel, a coupling paste or the like, can also be easily provided due to the construction according to the invention. In this case, the respective ultrasound transducer body 4 or 7 and the electrode 27 can be held in position and the electrical contacting can be ensured merely by the contact force of the spring 9.

The connecting lug 28 is crimped at a radial distance from the outer diameter of the electrode 27 to avoid undesired electrical contact with the outer surface of the piezoceramic disc. For this reason, a shaping or recess 26 is provided in the region of the surface 23. This also ensures an unambiguous orientation of the electrode 27 and connecting lug 28 in relation to the corresponding solder bore 36 in the printed circuit board 10.

Contacting (signal contacting) is implemented via the spring 9, which is either soldered directly to the printed circuit board 10 or contacts a conductor path located thereon. For the latter scenario, a retaining part 24 is provided for positioning of the spring 9.

FIG. 13A shows a partly sectional, simplified basic illustration of the installed position of a cup-shaped housing insert 5 with just one ultrasound transducer body 4. The insert part 5 may have one of the above-described electrode types (an electrode 27 and contacting as described in FIGS. 2A to 2C are illustrated). The metallization on both sides of the ultrasound transducer body and the sound-coupling compound are not illustrated in FIG. 13 for the sake of clarity. The housing insert 5 is introduced into an aperture in the housing 2 or housing part and is sealed with respect to the housing via an O-ring 46. The closure part 37 is inserted into the recess 45 in the upper face. The connecting lug 28 and the connecting contact of the spring 9 protrude through the cutout 39 and the bore 38 respectively and out through the upper face of the closure part 37 and can be contacted directly with a printed circuit board (not illustrated). It is thus possible to dispense with the use of cable connections, for example coaxial cables.

The housing insert 5 has a thin-walled base and consists of plastic, and therefore the ultrasound signal produced by the ultrasound transducer body can enter the medium through the base.

The illustrations in FIG. 13B show a corresponding cup-shaped housing insert 5, in which the ultrasound transducer body 4, which likewise has a metallization (not illustrated in FIG. 13B) on both sides, is contacted by means of electrodes 27a and 27b, which are arranged on either side and each have a connecting lug 28a and 28b respectively. The connecting lugs 28a, 28b extend upwardly along the housing insert 5 via recesses 26a, 26b on either side in the surface 23 and extend out through respective cutouts 39a and 39b in the closure part 37. In this embodiment the spring 9 merely provides a mechanical retaining force and does not ensure any electrical contacting. The upper-face electrode 27b is inserted and is held in position merely by the spring 9 in conjunction with the closure part 37. The arrangement is introduced into a housing opening in accordance with the arrangement according to FIG. 13A.

The cup-shaped housing insert 5 can be pre-produced together with the components located therein as a module that can be handled separately.

FIG. 14 shows a housing 2 both in a sectional illustration (FIG. 14A) and in a perspective illustration (FIG. 14B) with two upper-face housing openings, into each of which a housing insert 5 of the previously described type is inserted. As can be seen from FIG. 14A, the housing insert 5 terminates approximately flush with a bearing plane for the printed circuit board (not illustrated), and therefore direct contacting can be implemented.

LIST OF REFERENCE SIGNS 1 flowmeter
2 housing
3 measuring insert
4 ultrasound transducer body
5 housing insert
6 bearing surface
7 ultrasound transducer body
8 spring
9 spring
10 printed circuit board
11 casting compound
12 module
13 seal element
14 peg
15 temperature sensor
16 housing opening
17 step
18 surface
19 housing inner wall
20 through-opening
21 dome
22 bore
23 surface
24 retaining part
25 bracing rib
26 indentation
27 electrode
28 connecting lug
29 shaping
30 deflecting mirror
31 deflecting mirror holder
32 frame
33 bore
34 bore
35 seal element
36 solder bore
37 closure part
38 bore
39 cutout
40 metallization
41 metallization
42 contact layer
43 sound-coupling compound
44 conductor structure
45 pocket-shaped recess
46 O-ring

The invention claimed is:

1. An ultrasound transducer assembly for an ultrasound flowmeter, comprising a one-part or multi-part housing, which is provided to be connected to a line carrying the medium to be measured, wherein the ultrasound transducer transmits ultrasound through the housing and comprises:
   an ultrasound transducer body with a first main surface on the side facing the medium and a second main surface on the side facing away from the medium,
   first, contact means for electrically contacting the first main surface of the ultrasound transducer body,
   second, contact means for electrically contacting the second main surface of the ultrasound transducer body,
   wherein the first contact means are located between the ultrasound transducer body and the housing, through which ultrasound is to be transmitted, of the ultrasound flowmeter, wherein
   the first contact means of the ultrasound transducer body are placed or fixed in the housing, in a housing part or in a housing insert.

2. The ultrasound transducer assembly as claimed in claim 1, wherein
   a loose electrode is provided as the first contact means of the ultrasound transducer body.

3. The ultrasound transducer assembly as claimed in claim 1, wherein
   the first contact means are a contact layer applied to the housing, the housing part or to the housing insert.

4. The ultrasound transducer assembly as claimed in claim 1, wherein
   the first contact means are a conductor structure anchored in the housing, housing part or in the housing insert.

5. The ultrasound transducer assembly as claimed in claim 1, wherein
the ultrasound transducer body is fixed in position on the housing, housing part or on the housing insert under a bias acting in the axial direction.

6. The ultrasound transducer assembly as claimed in claim 5, wherein
a spring, which contacts the ultrasound transducer body on the side thereof facing away from the medium, is provided to fix the ultrasound transducer body in position.

7. The ultrasound transducer assembly as claimed in claim 1, wherein
the first contact means have a connecting part or contact a connecting part.

8. The ultrasound transducer assembly as claimed in claim 7, wherein
a connecting lug is provided as a connecting part.

9. The ultrasound transducer assembly as claimed in claim 8, wherein
the connecting lug is an integral component of the first contact means.

10. The ultrasound transducer assembly as claimed in claim 8, wherein
a spring is provided as contact means.

11. The ultrasound transducer assembly as claimed in claim 10, wherein
the spring extends along the outer periphery of the ultrasound transducer body.

12. The ultrasound transducer assembly as claimed in claim 1, wherein
the first and/or second contact means are connected directly to the printed circuit board of the ultrasound flowmeter.

13. An ultrasound transducer assembly for an ultrasound flowmeter, comprising a one-part or multi-part housing, which is provided to be connected to a line carrying the medium to be measured, wherein the ultrasound transducer transmits ultrasound through the housing and comprises:
an ultrasound transducer body with a first main surface on the side facing the medium and a second main surface on the side facing away from the medium,
first, contact means for electrically contacting the first main surface of the ultrasound transducer body,
second, contact means for electrically contacting the second main surface of the ultrasound transducer body,
wherein the first contact means are located between the ultrasound transducer body and the housing, through which ultrasound is to be transmitted, of the ultrasound flowmeter, wherein
the housing has a housing opening,
a pot-shaped housing insert through which ultrasound can be transmitted can be introduced into the housing opening, and
the housing insert is designed to receive the ultrasound transducer body.

14. The ultrasound transducer assembly as claimed in claim 13, wherein
a closure part is provided to close the upper face of the housing insert.

15. An ultrasound transducer assembly for an ultrasound flowmeter, comprising a one-part or multi-part housing, which is provided to be connected to a line carrying the medium to be measured, wherein the ultrasound transducer transmits ultrasound through the housing and comprises:
an ultrasound transducer body with a first main surface on the side facing the medium and a second main surface on the side facing away from the medium,
first, contact means for electrically contacting the first main surface of the ultrasound transducer body,
second, contact means for electrically contacting the second main surface of the ultrasound transducer body,
wherein the first contact means are located between the ultrasound transducer body and the housing, through which ultrasound is to be transmitted, of the ultrasound flowmeter, wherein the ultrasound transducer assembly has a first and second ultrasound transducer body, wherein
an electrical contacting of the first main surface is provided, is fixed on the housing side and is common to the first and second ultrasound transducer bodies.

16. An ultrasound flowmeter, comprising the ultrasound transducer assembly as claimed in claim 1.

17. The ultrasound transducer assembly according to claim 1, wherein said one-part or multi-part housing consists of plastic.

18. The ultrasound transducer assembly according to claim 1, wherein said first and second contact means are planar.

19. An ultrasound flowmeter, comprising the ultrasound transducer assembly as claimed in claim 13.

20. An ultrasound flowmeter, comprising the ultrasound transducer assembly as claimed in claim 15.

* * * * *